United States Patent
Nowak et al.

(10) Patent No.: US 9,825,172 B2
(45) Date of Patent: Nov. 21, 2017

(54) FIELD EFFECT TRANSISTOR STRUCTURE AND METHOD OF FORMING SAME

(71) Applicant: GLOBALFOUNDRIES INC., Grand Cayman (KY)

(72) Inventors: Edward J. Nowak, Shelburne, VT (US); Richard Q. Williams, Essex Junction, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/457,545

(22) Filed: Aug. 12, 2014

(65) Prior Publication Data

US 2014/0353755 A1    Dec. 4, 2014

Related U.S. Application Data

(62) Division of application No. 13/046,902, filed on Mar. 14, 2011, now Pat. No. 8,835,261.

(51) Int. Cl.
*H01L 29/78* (2006.01)
*H01L 21/8234* (2006.01)
*H01L 29/66* (2006.01)

(52) U.S. Cl.
CPC .... *H01L 29/785* (2013.01); *H01L 21/823431* (2013.01); *H01L 29/66795* (2013.01); *H01L 29/66818* (2013.01)

(58) Field of Classification Search
CPC ............. H01L 29/7831; H01L 29/7855; H01L 29/785; H01L 29/66795; H01L 29/66818; H01L 29/786; H01L 21/823431; H01L 21/823821; H01L 21/845; H01L 27/845; H01L 27/0924; H01L 27/10826
See application file for complete search history.

(56) References Cited

U.S. PATENT DOCUMENTS

| | | | | |
|---|---|---|---|---|
| 5,447,885 A * | 9/1995 | Cho | ........................ | H01L 21/32 257/E21.258 |
| 5,683,933 A | 11/1997 | Seino | | |
| 5,726,091 A * | 3/1998 | Tsai | ........................ | H01L 21/32 257/E21.258 |
| 6,225,178 B1 * | 5/2001 | Shaw | ................ | H01L 21/76216 257/E21.557 |
| 6,475,869 B1 | 11/2002 | Yu | | |

(Continued)

OTHER PUBLICATIONS

Wu et al., "Impacts of Nonrectangular Fin Cross Section on the Electrical Characteristics of FinFET," 2005, pp. 63-68, vol. 52, IEEE Transactions on Electron Devices.

(Continued)

*Primary Examiner* — Galina Yushina
(74) *Attorney, Agent, or Firm* — Michael Le Strange; Hoffman Warnick LLC

(57) ABSTRACT

The disclosure relates generally to a metal-oxide-semiconductor field effect transistor (MOSFET) structures and methods of forming the same. The MOSFET structure includes at least one semiconductor body on a substrate; a dielectric cap on a top surface of the at least one semiconductor body, wherein a width of the at least one semiconductor body is less than a width of the dielectric cap; a gate dielectric layer conformally coating the at least one semiconductor body; and at least one electrically conductive gate on the gate dielectric layer.

10 Claims, 21 Drawing Sheets

(56) References Cited

U.S. PATENT DOCUMENTS

| | | |
|---|---|---|
| 6,911,697 B1 | 6/2005 | Wang et al. |
| 6,936,882 B1 * | 8/2005 | Ahmed ............. H01L 21/82344 257/314 |
| 6,951,783 B2 | 10/2005 | Mathew et al. |
| 6,967,175 B1 | 11/2005 | Ahmed et al. |
| 7,625,790 B2 | 12/2009 | Yang |
| 2004/0262692 A1 * | 12/2004 | Hareland ............. H01L 29/1054 257/369 |
| 2004/0266083 A1 | 12/2004 | Hareland et al. |
| 2005/0026333 A1 * | 2/2005 | Hareland ............... B82Y 10/00 438/128 |
| 2005/0093082 A1 | 5/2005 | Son et al. |
| 2005/0202607 A1 | 9/2005 | Furukawa |
| 2005/0202608 A1 * | 9/2005 | Beintner ............... H01L 29/785 438/164 |
| 2005/0272192 A1 * | 12/2005 | Oh .................... H01L 29/66553 438/197 |
| 2007/0082437 A1 | 4/2007 | Cheng et al. |
| 2008/0283910 A1 | 11/2008 | Dreeskornfeld et al. |
| 2009/0090934 A1 * | 4/2009 | Tezuka ................ H01L 27/1211 257/190 |

OTHER PUBLICATIONS

Li et al., "Simulation of Nanoscale Round-Top-Gate Bulk FinFETs with Optimal Geometry Aspect Radio," 2006, pp. 569-572, IEEE.

Wu et al., "Analysis of Geometry-Dependent Parasitics in Multifin Double-Gate FinFETs," Apr. 2007, pp. 692-698, vol. 54, IEEE Transactions on Electron Devices.

U.S. Appl. No. 13/046,902, filed Mar. 14, 2011, Office Action dated Jun. 20, 2013.

U.S. Appl. No. 13/046,902, filed Mar. 14, 2011, Office Action dated Oct. 18, 2013.

U.S. Appl. No. 13/046,902, filed Mar. 14, 2011, Notice of Allowance dated May 9, 2014.

* cited by examiner

FIELD EFFECT TRANSISTOR STRUCTURE AND METHOD OF FORMING SAME

TECHNICAL FIELD

The disclosure relates generally to field effect transistor (FET) structures and methods of forming the same, and more particularly, to metal-oxide-semiconductor (MOS) FET structures and methods of forming MOSFET structures.

BACKGROUND

The use of non-planar multigate MOSFETs is one of several strategies for creating smaller and more efficient microprocessors, memory cells, and etc. Devices incorporating non-planar multigate MOSFETS typically consume less power and exhibit enhanced performance. It can be a challenging proposition when trying to incorporate non-planar multigate transistors into conventional semiconductor manufacturing processes.

SUMMARY

An aspect of the present invention relates to a metal-oxide-semiconductor field effect transistor (MOSFET) structure comprising: at least one semiconductor body on a substrate; a dielectric cap on a top surface of the at least one semiconductor body, wherein a width of the at least one semiconductor body is less than a width of the dielectric cap; a gate dielectric layer conformally coating the at least one semiconductor body; and at least one electrically conductive gate on the gate dielectric layer.

A second aspect of the present invention relates to a method for forming a metal-oxide-semiconductor field effect transistor (MOSFET) structure, the method comprising: providing a semiconductor substrate having a dielectric layer thereon; forming at least one semiconductor body having a dielectric cap on a top surface of the at least one semiconductor body from the dielectric layer and a semiconductor layer of the semiconductor substrate; removing a portion of opposite first and second side walls of the at least one semiconductor body resulting in a width of the at least one semiconductor body is less than a width of the dielectric cap; forming a gate dielectric layer on the at least one semiconductor body; and forming at least one electrically conducting gate on the gate dielectric layer.

A third aspect of the present invention relates to a method for forming a metal-oxide-semiconductor field effect transistor (MOSFET) structure, the method comprising: providing a semiconductor substrate; forming a patterned masking layer on the semiconductor substrate; etching a semiconductor layer of the semiconductor substrate to form at least one semiconductor body; removing the patterned masking layer; depositing an oxidation blocking material on the at least one semiconductor body; etching back the oxidation blocking material to expose an upper portion of the at least one semiconductor body; oxidizing the upper portion of the at least one semiconductor body so as to form a dielectric cap over the upper portion of the at least one semiconductor body, wherein a width of the at least semiconductor body is less than a width of the dielectric cap; removing the oxidation blocking material; forming a gate dielectric layer on the at least one semiconductor body; and forming at least one electrically conducting gate on the gate dielectric layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

It has been discovered that some multigate metal-oxide-semiconductor field effect transistors (MOSFET) such as FinFETs may have a reduced drive current to intrinsic capacitance ratio when compared to other multigate structures such as trigate or omega-gate structures. The cause may be partially attributed to a capacitance present on a top channel of the FinFET where there typically is no channel conduction. Attempts to alleviate this issue have been made by changing a dielectric height and/or dielectric composition.

Figure 1:
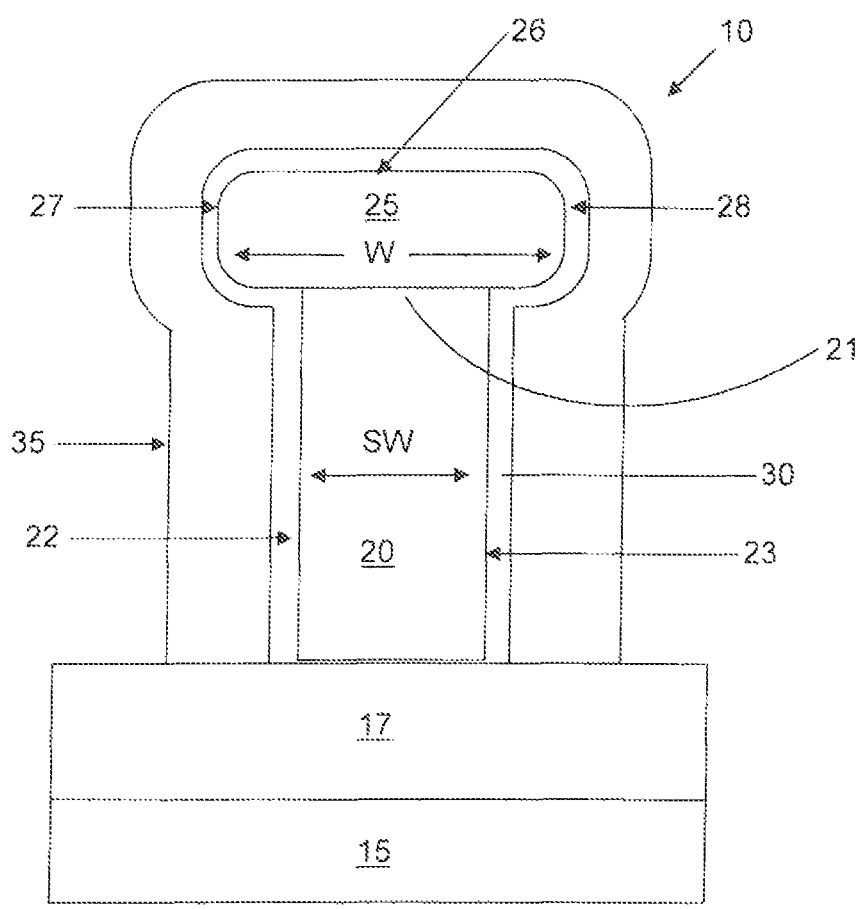
FIG. 1 depicts a cross-sectional view of an embodiment of a metal-oxide-semiconductor field effect transistor (MOSFET) structure, in accordance with the present invention.

A cross-sectional view of an embodiment of a MOSFET structure is presented in FIG. 1 and in particular, a FinFET structure is presented, in accordance with the present invention. Referring to FIG. 1, a structure 10 is shown having a substrate 15, a dielectric layer 17 thereon, a semiconductor body 20, a dielectric cap 25, a gate dielectric layer 30, and at least one electrically conducting gate 35.

Substrate 15 may be a semiconductor substrate comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole fraction). Semiconductor substrate 15 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole fraction). Processes to provide semiconductor substrate 15, as illustrated and described, are well known in the art. In an embodiment of the present invention, semiconductor substrate 15 may comprise a p-type doped substrate. Examples of p-type dopants include but are not limited to boron (B), indium (In), and gallium (Ga).

Dielectric layer 17 may be a material such as but not limited to silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ); methyl silsesquioxane polymer (MSQ); SiLK™ (polyphenylene oligomer) manufactured by Dow Chemical, Midland, Mich.; Black Diamond™ [$SiO_x(CH_3)_y$] manufactured by Applied Materials, Santa Clara, Calif.; fluorinated tetraethylorthosilicate (FTEOS), and fluorinated silicon glass (FSG).

Dielectric layer 17 may also comprise multiple dielectric layers, for example, a first low-k (dielectric constant) layer and a second dielectric layer such as silicon nitride and/or silicon oxide. The second dielectric layer may have a higher k dielectric constant value than the first low-k dielectric layer. Low-k dielectric layers include materials having a relative permittivity value of 4 or less, examples of which include but are not limited to HSQ, MSQ, SiLK™ Black Diamond™ FTEOS, and FSG.

Semiconductor body 20 may be a rectangular, column-like structure seated on substrate 15 with dielectric layer 17 therebetween. Semiconductor body 20 may also be described as a 3-dimensional protrusion that projects upward from substrate 15. Semiconductor body 20 may include a top 21, and opposite first and second sidewalls 22 and 23. Semiconductor body 20 may also have a width SW defined by a longest distance from opposite first sidewall 22 to opposite second sidewall 23. In an embodiment, width SW may range from 5 nm to 20 nm. In another embodiment, width SW may be approximately 1 nm. Semiconductor body 20 may comprise Si, Silicon-Germanium (SiGe), a Group IV element, and combinations thereof. Semiconductor body 20 may also be a semiconductor heterostructure, a silicon fin, and etc. In an embodiment, semiconductor body 20 may be a silicon fin.

Dielectric cap 25 may be seated on semiconductor body top 21 such that dielectric cap 25 and semiconductor body 20 may form a T-shape. Dielectric cap 25 may also have a width W defined by a longest distance from opposite first sidewall 27 to opposite second sidewall 28. In an embodiment, width W may in range from approximately 6 nm to approximately 25 nm. In another embodiment, dielectric cap 25 width W may be greater than semiconductor body 20 width SW. In another embodiment, width W may be greater than the semiconductor body 20 width SW in a range from approximately 1 nm to approximately 5 nm.

Dielectric cap 25 may be in the shape of a sphere, a rectangle, a square, and an oblong. An oblong may include rectangles whose length is greater than its width. In an embodiment, when dielectric cap 25 is in the shape of a rectangle, a square, or an oblong, the corners of the aforementioned may be rounded off and may lack defined corner angles where applicable. In another embodiment, dielectric cap 25 may have a match stick shaped head (see FIG. 21) where a bottom portion of dielectric cap 25 may be tapered along a portion of semiconductor body 20.

Dielectric cap 25 may be a material such as but not limited to silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ); methyl silsesquioxane polymer (MSQ); SiLK™ (polyphenylene oligomer) manufactured by Dow Chemical, Midland, Mich.; Black Diamond™ [$SiO_x(CH_3)_y$] manufactured by Applied Materials, Santa Clara, Calif.; fluorinated tetraethylorthosilicate (FTEOS), and fluorinated silicon glass (FSG). In an embodiment, dielectric cap 25 may be silicon oxide ($SiO_2$).

Gate dielectric layer 30 may conformally coat semiconductor body 20 and have a thickness in a range from approximately 0.5 nm to approximately 2 nm. Gate dielectric layer 30 may also partially coat or conformally coat dielectric cap 25. Gate dielectric layer may be a material such as but not limited to conventional Group IV oxides like, for example, $SiO_2$; siliconoxynitride (SiON); and dielectric multilayers for high-K metal gate stack processes. Gate dielectric layer may have at least one electrically conductive gate 35 thereon. Electrically conductive gates used in MOSFET and in particular, FinFET technologies are known in the art.

Figure 2:
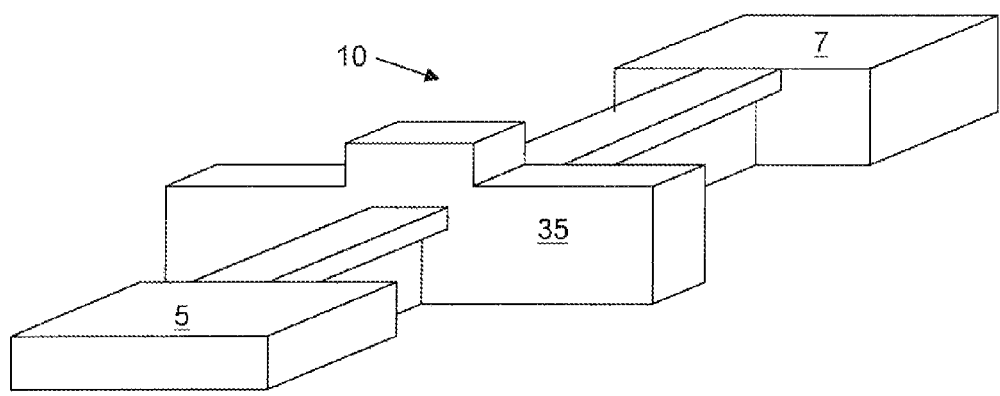
FIG. 2 depicts a schematic view of an embodiment of a MOSFET structure, in accordance with the present invention.

A schematic view of an embodiment of MOSFET structure 10 is presented in FIG. 2 and in particular, a FinFET structure is presented, in accordance with the present invention. Structure 10 may additionally comprise a source region 5 and a drain region 7 on opposite sides of semiconductor body 20. In an embodiment, structure 10 may be a FinFET structure. One having ordinary skill in the art will recognize the relation of source region 5 and drain region 7 within FinFET structure 10

Referring to FIGS. 1 and 2, and in an embodiment, structure 10 may be a multigate MOSFET structure, and in particular, a multigate FinFET structure comprising multiple semiconductor bodies 20 and corresponding dielectric cap 25 on substrate 15. The multigate MOSFET structure may also comprise gate dielectric 30 and electrically conductive gate 35. Examples of multigate MOSFET structures include but are not limited to trigate and Omega gate structures. One having ordinary skill in the art will recognize the aforementioned.

Embodiments of MOSFET structures described herein may be used with integrated circuit chips that may be distributed by a fabricator in a raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

Figure 3:
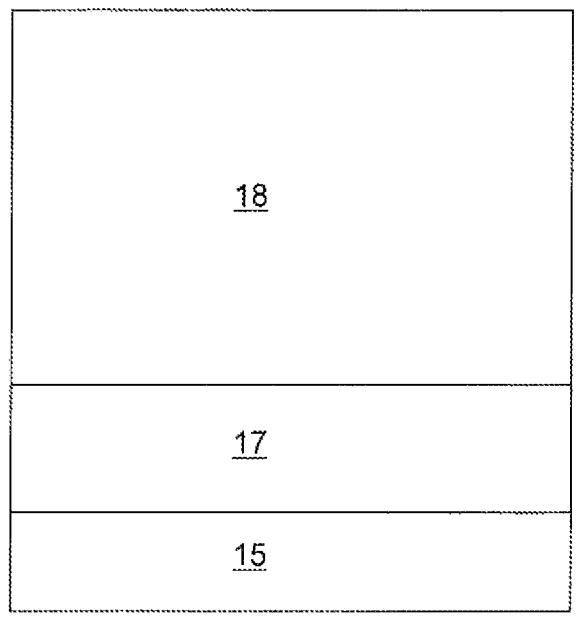
FIG. 3 depicts a step of an embodiment of a method for forming a MOSFET structure, in accordance with the present invention.

An embodiment of steps of a method for forming MOSFET structure 10 are shown in FIGS. 3-8, in accordance with the present invention. Referring to FIG. 3, a substrate 15 comprising silicon, silicon germanium, or gallium arsenide may be provided already having a dielectric layer 17 thereon. In an embodiment, substrate 15 may be bulk silicon. In another embodiment, substrate 15 may be a silicon-on-insulator (SOI) wafer comprising a silicon layer 18 on a buried dielectric layer 17 which may overlay substrate 15 having a silicon bulk portion. Silicon layer 18 may have a thickness in a range from approximately 10 nm to approximately 100 nm. In an embodiment, silicon layer 18 may have a thickness of approximately 30 nm.

Figure 4:
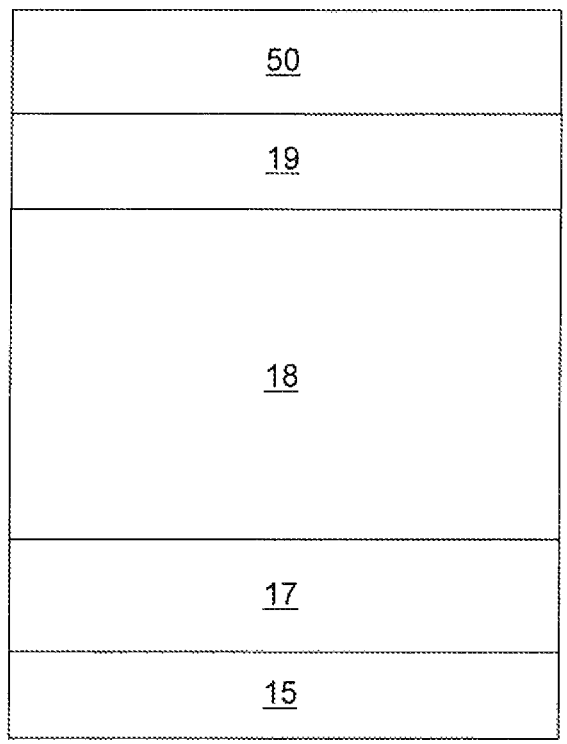
FIG. 4 depicts another step of an embodiment of a method for forming a MOSFET structure, in accordance with the present invention.

Referring to FIG. 4, dielectric layer 19 may be deposited on SOI substrate 15, and in particular, silicon layer 18 using any now known or later developed techniques appropriate for the material to be deposited. Such techniques include but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. In an embodiment, dielectric layer 19 may be a low-k dielectric layer such as SiLK™ SiCOH, Black Diamond™ FTEOS, or FSG. In another embodiment, dielectric layer 19 may have a thickness in a range from approximately 5 nm to approximately 50 nm.

A photoresist material may be deposited on dielectric layer 19 and patterned to form a patterned hard mask 50 for subsequent process steps. Photoresist materials used for hard mask 50 and methods of patterning hard mask 50 are known in the art.

Figure 5:
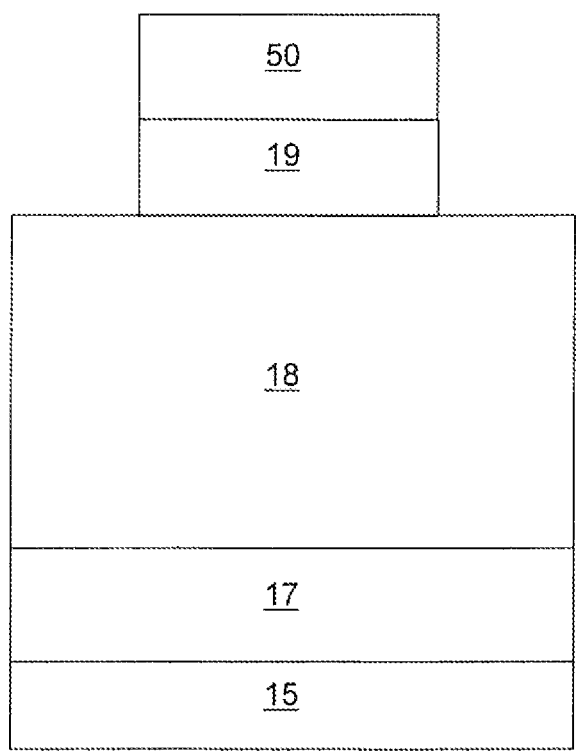
FIG. 5 depicts another step of an embodiment of a method for forming a MOSFET structure, in accordance with the present invention.

Referring to FIG. 5, a photolithographic etch may be performed partially etching hard mask 50 and dielectric layer 19 by conventional photolithographic processes, with the etching terminating at silicon layer 18.

Figure 6:
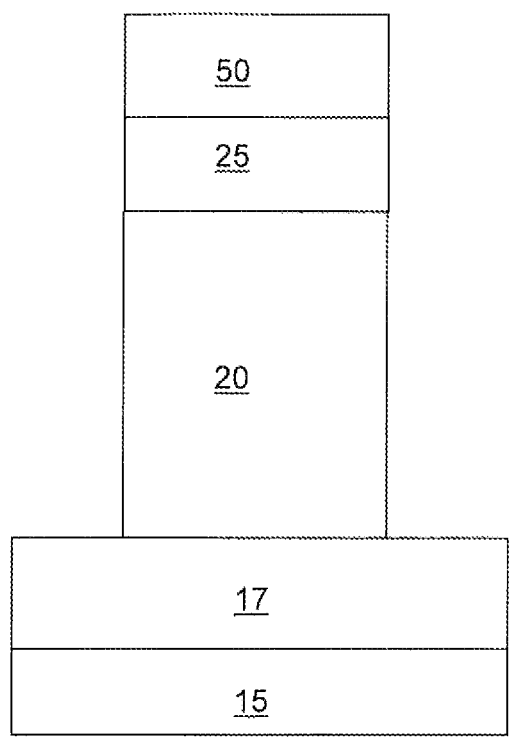
FIG. 6 depicts another step of an embodiment of a method for forming a MOSFET structure, in accordance with the present invention.

Referring to FIG. 6, a blanket anisotropic etch may then be performed etching away exposed portions of silicon layer 18 (see FIG. 5) resulting in the formation of semiconductor body 20 comprising silicon and having a dielectric cap 25 thereon. In an embodiment, semiconductor body 20 may provide or include a silicon fin. Semiconductor body 20 and dielectric cap 25 may be further etched via wet etching. Wet etching techniques for the etching of a dielectric layer and silicon layer are known in the art. In an embodiment, an anisotropic or isotropic process with a slow etch and controllable etch rate may be performed to further etch semiconductor body 20 and dielectric cap 25.

Figure 7:
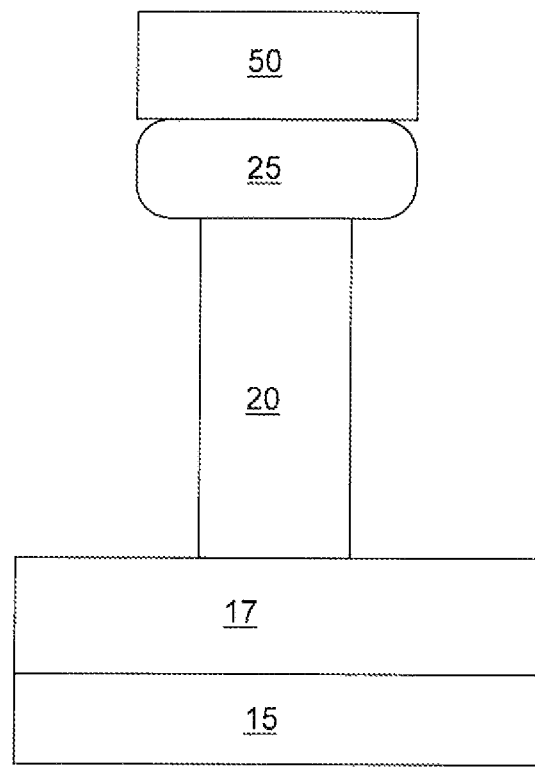
FIG. 7 depicts another step of an embodiment of a method for forming a MOSFET structure, in accordance with the present invention.

Referring to FIG. 7, semiconductor body 20 may be wet etched resulting in additional silicon being removed and dielectric cap 25 may be wet etched resulting in its corners being rounded off. Hard mask 50 may then be removed resulting in semiconductor body 20 having dielectric cap 25 thereon. Various embodiments of semiconductor body 20 and dielectric cap 25 have been previously described herein.

Figure 8:
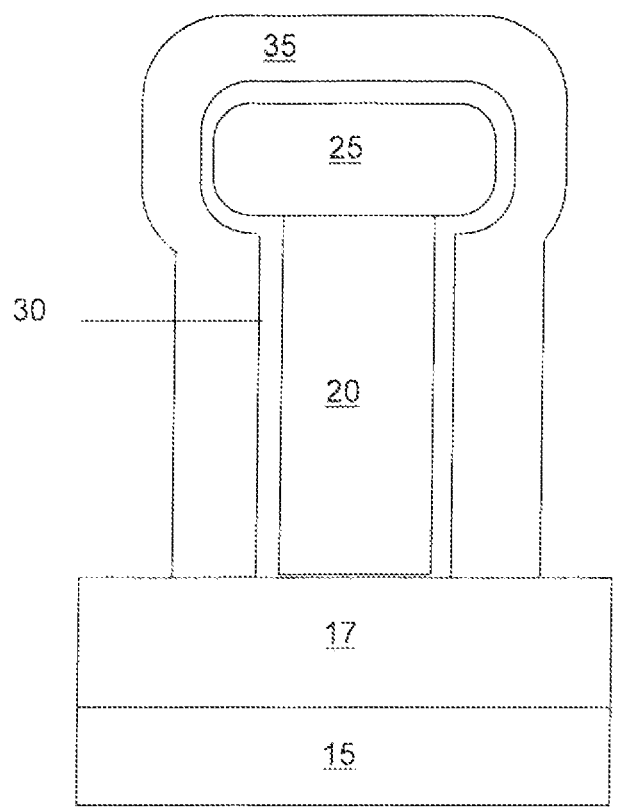
FIG. 8 depicts another step of an embodiment of a method for forming a MOSFET structure, in accordance with the present invention.

Referring to FIG. 8, gate dielectric 30 then may be formed onto semiconductor body 20. In an embodiment, gate dielectric 30 may be formed on semiconductor body 20 and dielectric cap 25. Materials used for gate dielectric 30 and techniques for forming the same are known in the art and techniques for forming the same also known in the art. In an embodiment, gate dielectric 30 may comprise conventional high-K dielectrics and may be formed by conventional deposition techniques.

Alternatively, gate dielectric 30 may be conformally coated just on semiconductor body 20. For example, semiconductor body 20 may comprise silicon or a silicon composite that may be susceptible to conventional silicon-oxidation processes while dielectric cap 25 may comprise a material not susceptible to conventional silicon-oxidation processes.

At least one electrically conducting gate 35 may be formed on gate dielectric 30. Materials used for electrically conducting gate 35 and techniques for forming the same with semiconductor bodies, for example, fin structures are known in the art. In an embodiment, at least one electrically conducting gate 35 may comprise titanium nitride (TiN). Various embodiments of gate dielectric 30 and at least one electrically conducting gate 35 have been previously described herein.

After formation of semiconductor body 20, dielectric cap 25, and at least one electrically conducting gate 35, source region 5, and drain region 7 (see FIG. 2) may be formed (e.g., by deposition or epitaxial growth of a semiconducting material) on opposite sides of semiconductor body 20. For example, a layer of silicon, germanium, or combination of silicon and germanium may be deposited, patterned, and etched in any conventional manner known in the art to form the source and drain regions. Alternatively, the source and drain regions may be formed by photolithographic processes. The result of embodiments of the method of the present invention described herein may be the formation of a MOSFET structure 10 and in particular, a FinFET structure.

In an embodiment, the method of the present invention described herein may be used to form a multigate MOSFET structure and in particular, a multigate FinFET structure comprising multiple semiconductor bodies 20 and a corresponding dielectric cap 25 on substrate 15. The multigate MOSFET structure may also comprise gate dielectric 30 and electrically conductive gate 35. The embodiments of the method steps previously described herein and depicted in FIGS. 3-8, may be repeated as many times as preferred at each stage to form the multigate MOSFET structure comprising multiple semiconductor bodies 20 and corresponding dielectric cap 25, gate dielectric 30, electrically conductive gate 35, and etc.

Figure 9:
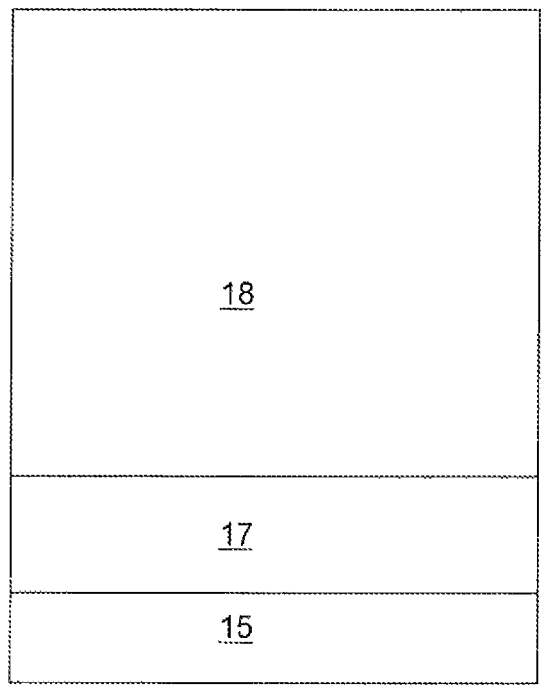
FIG. 9 depicts another step of an embodiment of a method for forming a MOSFET structure, in accordance with the present invention.

Another embodiment of steps of a method for forming MOSFET structure 10 are shown in FIGS. 9-17, in accordance with the present invention. Referring to FIG. 9, a substrate 15 comprising bulk silicon, a silicon-on-insulator (SOI), silicon germanium, or gallium arsenide maybe provided. In an embodiment, substrate 15 may be the SOI wafer comprising a silicon layer 18 on a buried oxide layer 17 which may overlay a silicon bulk portion 15. Silicon layer 18 may have a thickness of approximately 30 nm.

Figure 10:
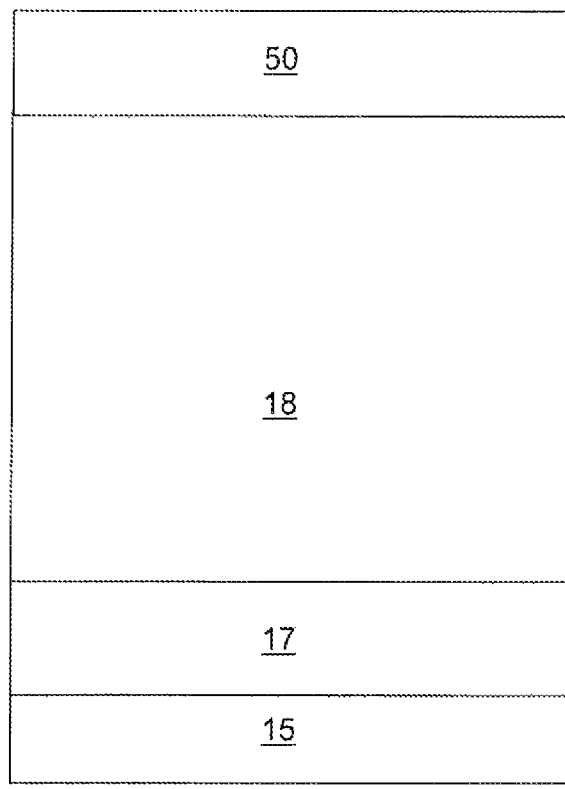
FIG. 10 depicts another step of an embodiment of a method for forming a MOSFET structure, in accordance with the present invention.

Referring to FIG. 10, a photoresist material may be deposited on silicon layer 18 and patterned to form a patterned hard mask 50 for subsequent process steps. Photoresist materials used for hard mask 50 and methods for patterning hard mask 50 are known in the art.

Figure 11:
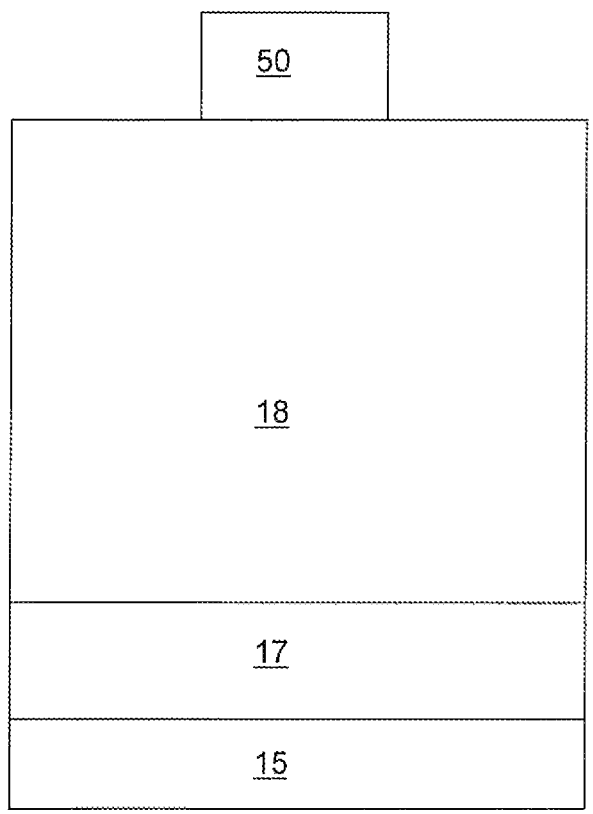
FIG. 11 depicts another step of an embodiment of a method for forming a MOSFET structure, in accordance with the present invention.

Referring to FIG. 11, a photolithographic etch may be performed partially etching hard mask 50 by conventional photolithographic processes, with the etching terminating at silicon layer 18.

Figure 12:
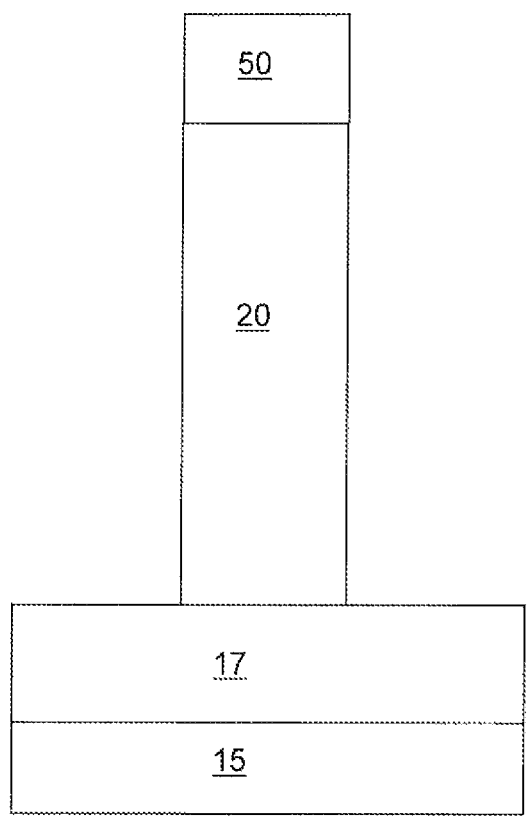
FIG. 12 depicts another step of an embodiment of a method for forming a MOSFET structure, in accordance with the present invention.

Referring to FIG. 12, a blanket anisotropic etch using, for example, hydrogen fluoride, may then be performed etching away exposed portions of silicon layer 18 (see FIG. 11) resulting in the formation of a semiconductor body 20 comprising silicon and having patterned hard mask 50 thereon. In an embodiment, semiconductor body 20 may provide or include a silicon fin.

Figure 13:
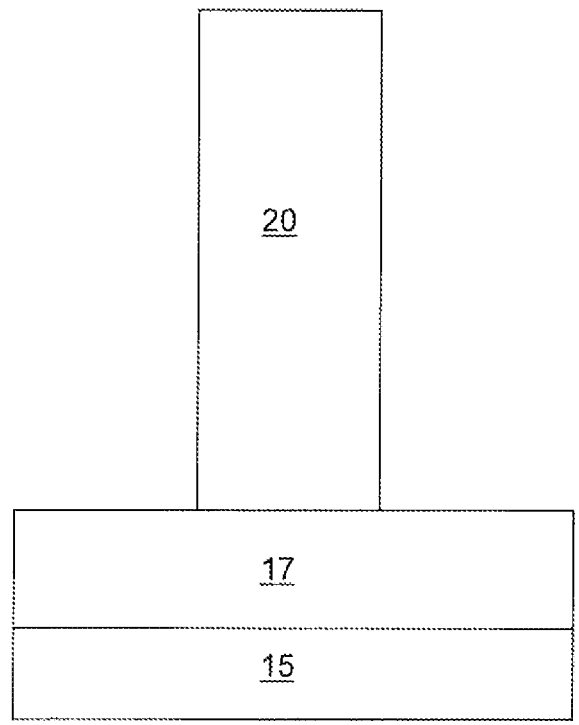
FIG. 13 depicts another step of an embodiment of a method for forming a MOSFET structure, in accordance with the present invention.

Referring to FIG. 13, patterned hard mask 50 may then be removed from semiconductor body 20 by conventional techniques known in the art.

Figure 14:
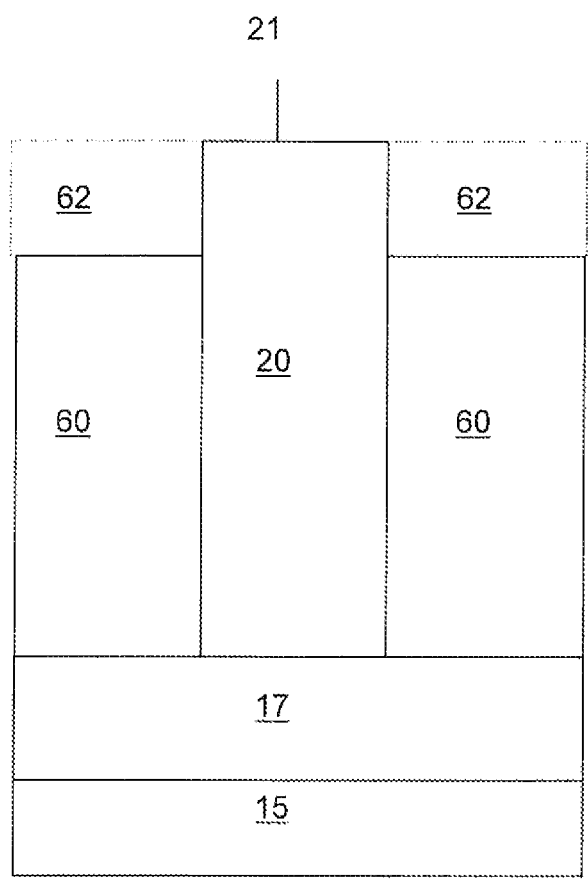
FIG. 14 depicts another step of an embodiment of a method for forming a MOSFET structure, in accordance with the present invention.

Referring to FIG. 14, an oxidation blocking material 60 may be filled around semiconductor body 20 up to but not over a top 21 of semiconductor body 20. In an embodiment, oxidation blocking material 60 may be a silicon-oxidation blocking material. Materials used to block oxidation and silicon-oxidation in particular, and methods for their application are known in the art. In an embodiment, blocking material 60 may be filled around semiconductor body 20 via conventional deposition techniques. Oxidation blocking material 60 may then be back etched removing a portion 62 of oxidation blocking material 60 and leaving a portion of semiconductor body 20 exposed.

Alternatively (not shown), oxidation blocking material 60 may be filled around semiconductor body 20 up to and over top 21. Oxidation blocking material 60 may then be subjected to a chemical-mechanical polish (CMP) so as to leave a thin layer or a substantially thinner layer of oxidation blocking material 60 on top 21 of semiconductor body 20. A conventional etching process may be used to remove the thin layer of oxidation blocking material 60 resulting in top 21 being exposed. In an another embodiment, oxidation blocking material 60 may then be subjected to a chemical-mechanical polish so as to remove oxidation blocking material 60 such that it may be flush with top 21 of semiconductor body 20. Top 21 may serve as a CMP etch stop.

Figure 15:
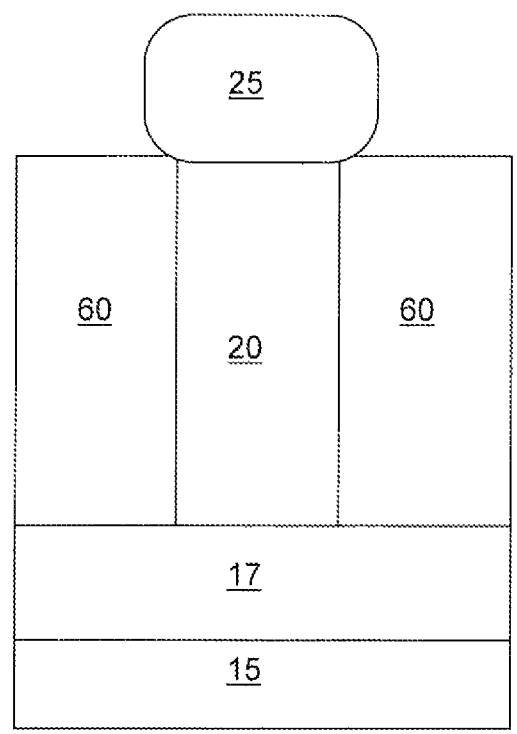
FIG. 15 depicts another step of an embodiment of a method for forming a MOSFET structure, in accordance with the present invention.

Referring to FIG. 15, the exposed portion of semiconductor body 20 may be allowed to oxidize to form a dielectric cap 25 thereon. Various embodiments of dielectric cap 25 have been described herein. Dielectric cap 25 may be formed by thermal oxidation. Not being held to any particular theory, as the exposed portion of semiconductor body 20 is being oxidized, surface tension may tend to create, for example, a spherical or an oblong dielectric cap 25 if a large enough portion of semiconductor body 20 is exposed.

Figure 16:
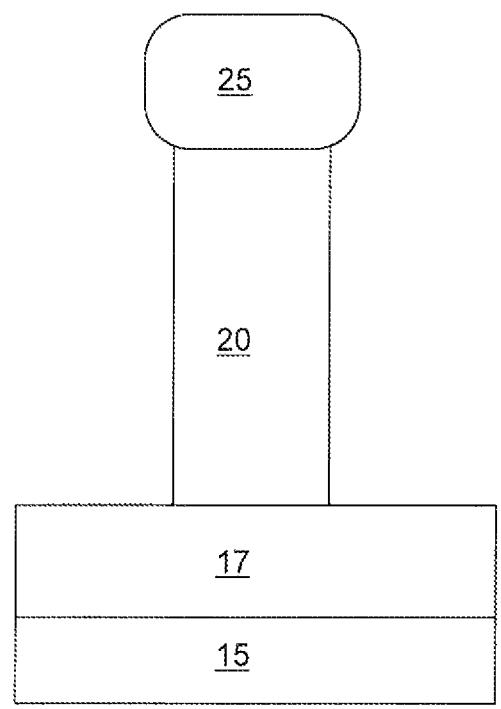
FIG. 16 depicts another step of an embodiment of a method for forming a MOSFET structure, in accordance with the present invention.

Referring to FIG. 16, after oxidation, oxidation blocking material 60 may be removed by conventional methods known in the art resulting in semiconductor body 20 having dielectric cap 25 thereon. In an embodiment, oxidation blocking material 60 may be removed by an etch selective to the oxidation of blocking material 60 used, for example, an etch selective to a nitride. Various embodiments of semiconductor body 20 have been previously described.

Figure 17:
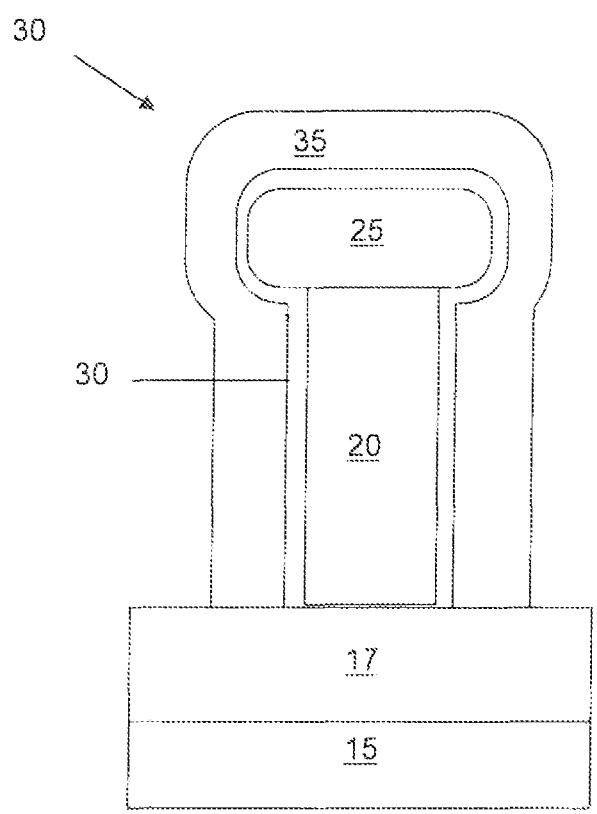
FIG. 17 depicts another step of an embodiment of a method for forming a MOSFET structure, in accordance with the present invention.

Referring to FIG. 17, gate dielectric 30 then may be conformally deposited onto semiconductor body 20. Alternatively, gate dielectric 30 may also be deposited on a portion of or conformally deposited on dielectric cap 25. Materials used for gate dielectric 30 and techniques for forming the same are known in the art. Various embodiments of gate dielectric 30 have been previously described herein. At least one electrically conducting gate 35 may then be formed on gate dielectric 30. Materials used for electrically conducting gate 35 and techniques for forming the same with fin structures are known in the art. Various embodiments of at least one electrically conductive gate have been previously described herein.

After formation of semiconductor body 20, dielectric cap 25, and at least one electrically conducting gate 35; source region 5 and drain region 7 (see FIG. 2) may be formed (e.g., by deposition or epitaxial growth of a semiconducting material) on opposite sides of semiconductor body 20. Source region 5 and drain region 7 are not shown in FIG. 17 but would be into and out of the plane of the cross-section of FIG. 17. Various embodiments of the source and drain regions, and methods for forming the same have been previously described. The result of embodiments of the method of the present invention described herein may be the formation of a MOSFET structure 10 and in particular, a FinFET structure.

In an embodiment, the method of the present invention described herein may be used to form a multigate MOSFET structure and in particular, a FinFET structure comprising multiple semiconductor bodies 20 and corresponding dielectric cap 25 on substrate 15. The multigate MOSFET structure may also comprise gate dielectric 30 and electrically conductive gate 35. The embodiments of the method steps previously described herein and depicted in FIGS. 9-17, may be repeated as many times as preferred at each step of the method to form a multigate MOSFET structure comprising multiple semiconductor bodies 20 and corresponding dielectric cap 25, gate dielectric 30, electrically conductive gate 35, and etc.

Another embodiment of steps of a method for forming MOSFET structure 10 are shown in FIGS. 9-15 and 18-21, in accordance with the present invention. Referring to FIGS. 9-15, the method steps depicted therein may be performed to give a semiconductor body 20 on a substrate 15 and having a dielectric cap 25 thereon, and an oxidation blocking material 60 that may be around semiconductor body 20 up to but not over a top 21 of semiconductor 20 (see FIG. 15). Various embodiments of the method steps performed to arrive at the aforementioned structure depicted in FIG. 15 have been previously described.

Figure 18:
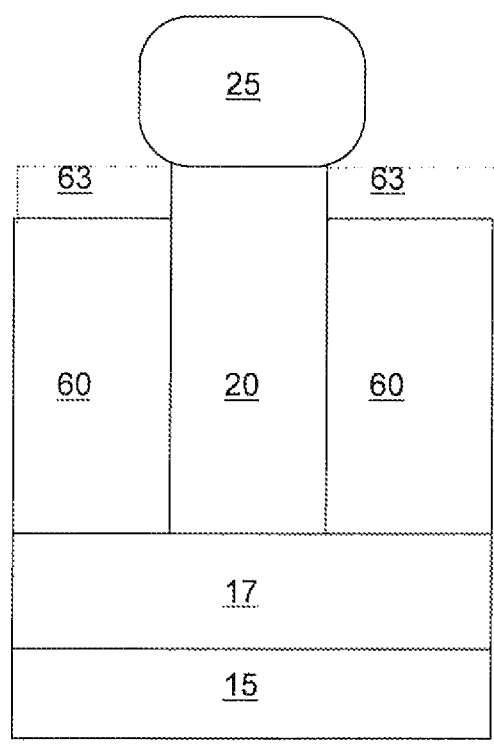
FIG. 18 depicts another step of an embodiment of a method for forming a MOSFET structure, in accordance with the present invention.

Referring to FIG. 18, oxidation blocking material 60 may be back etched again to remove a portion 63 of oxidation blocking material 60 leaving a portion of semiconductor body 20 exposed. In an embodiment, oxidation blocking material 60 may be a silicon-oxidation blocking material. Various embodiments for back etching oxidation blocking material 60 have been previously described.

Figure 19:
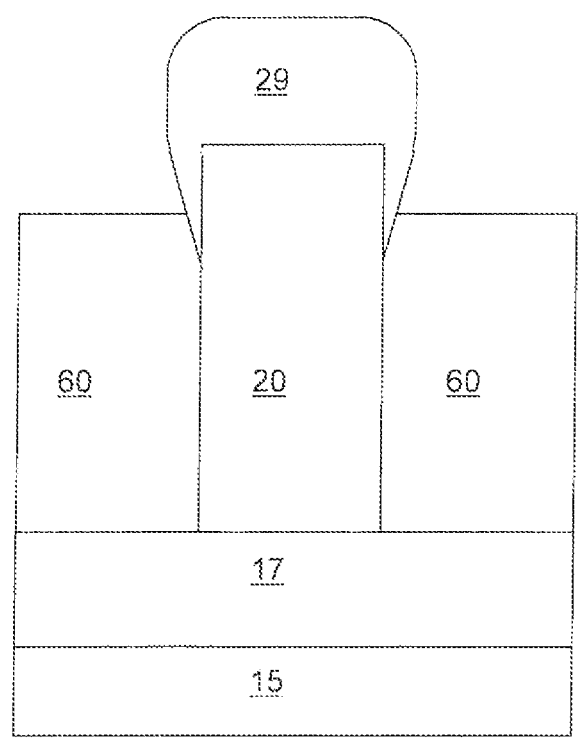
FIG. 19 depicts another step of an embodiment of a method for forming a MOSFET structure, in accordance with the present invention.

Referring to FIG. 19, the exposed portion of semiconductor body 20 may be allowed to oxidize such that dielectric cap 25 thereon may be extended and formed over the exposed portion of semiconductor body 20 resulting in the formation of a dielectric cap 29 having a partial taper. A bottom of dielectric cap 29 now may have a tapered contour as a result of the second oxidation step. In an embodiment, dielectric cap 29 may be described has having a cross-section shape of a match stick head. The extended portion of dielectric cap 29 may be controlled by the extent of the second back etching step. For example, the greater the amount of semiconductor body 20 that is exposed by back etching, the greater the extension of dielectric cap 29 may occur.

Figure 20:
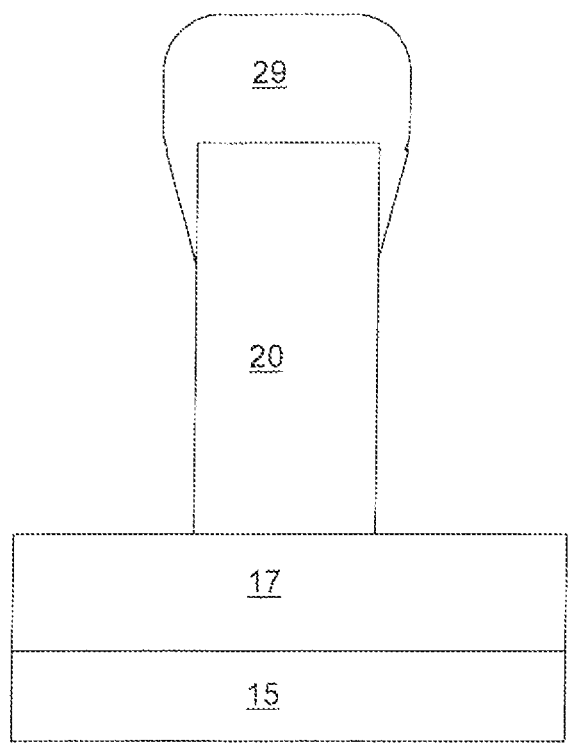
FIG. 20 depicts another step of an embodiment of a method for forming a MOSFET structure, in accordance with the present invention.

Referring to FIG. 20, after oxidation, oxidation blocking material 60 may be removed as previously described herein.

Figure 21:
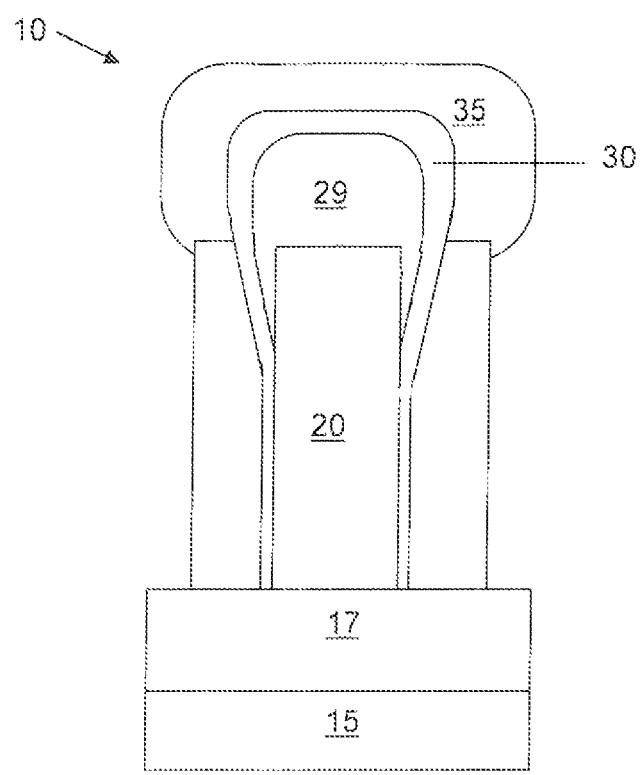
FIG. 21 depicts another step of an embodiment of a method for forming a MOSFET structure, in accordance with the present invention.

Referring to FIG. 21, a gate dielectric 30 then may be conformally deposited onto semiconductor body 20 and dielectric cap 29. In an embodiment, gate dielectric 30 may only be conformally deposited onto semiconductor body 20. Materials used for gate dielectric 30 and techniques for forming the same are known in the art. Various embodiments of gate dielectric 30 have been previously described herein. At least one electrically conducting gate 35 may then be formed on gate dielectric 30. Materials used for electrically conducting gate 35 and techniques for forming the same with MOSFET fin structures are known in the art. Various embodiments of electrically conducting gate 35 have been previously described herein.

After formation of semiconductor body 20, dielectric cap 29, gate dielectric 30, and at least one electrically conducting gate 35, source region 5 and drain region 7 (see FIG. 2) may be formed (e.g., by deposition or epitaxial growth of a semiconducting material) on opposite sides of semiconductor body 20. Source region 5 and drain region 7 (not shown in FIG. 21) may be into and out of the plane of the cross-section of FIG. 21. Various embodiments of the source and drain regions, and methods for forming the same have been previously described herein. The result of embodiments of the method of the present invention described herein may be the formation of a MOSFET structure 10 and in particular, a FinFET structure having a dielectric cap 29 that may be partially tapered.

In an embodiment, the method of the present invention described herein may be used to form a multigate MOSFET structure and in particular, a FinFET structure comprising multiple semiconductor bodies 20 and corresponding partially tapered dielectric cap 29 on substrate 15. The multi-gate MOSFET structure may also comprise gate dielectric 30 and electrically conductive gate 35. The embodiments of the method steps previously described herein and represented in FIGS. 9-15 and 18-21 may be repeated as many times as preferred at each step of the method to form the multi-gate MOSFET structure comprising multiple semiconductor bodies 20 and corresponding partially tapered dielectric cap 29, gate dielectric 30, electrically conductive gate 35, and etc.

The methods as described herein may be used in the fabrication of integrated circuit chips.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A metal-oxide-semiconductor field effect transistor (MOSFET) structure comprising:
   at least one semiconductor body on a substrate;
   a dielectric cap on a top surface of the at least one semiconductor body, wherein a width of the at least one semiconductor body is less than a maximum width of the dielectric cap, wherein the dielectric cap has a match stick head shaped cross section, wherein the match stick shaped head cross section is wider at a portion distal from the substrate than a portion proximal the substrate, and wherein a material of the dielectric cap tapers along the at least one semiconductor body from a portion of the at least one semiconductor body distal to the substrate to a portion of the at least one semiconductor body proximal to the substrate;
   a single gate dielectric layer conformally coating the at least one semiconductor body and the dielectric cap; and
   at least one electrically conductive gate on the gate dielectric layer.

2. The MOSFET structure according to claim 1, wherein the at least one semiconductor body includes a silicon fin.

3. The MOSFET structure according to claim 1, wherein the substrate may additionally comprise a dielectric layer thereon, the dielectric layer comprising a material selected from one of: silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ), methyl silsesquioxane polymer (MSQ), polyphenylene oligomer, $SiO_x(CH_3)_y$, fluorinated TEOS (FTEOS), or fluorinated silicon glass (FSG).

4. The MOSFET structure according to claim 1, wherein the width of the at least one semiconductor body is in a range from approximately 5 nm to approximately 20 nm and the width of the dielectric cap is in a range from approximately 6 nm to approximately 25 nm.

5. The MOSFET structure according to claim 1, wherein the width of the dielectric cap is in a range from approximately 1 nm to approximately 5 nm greater than the width of the at least one semiconductor body.

6. A method for forming a metal-oxide-semiconductor field effect transistor (MOSFET) structure, the method comprising:
   providing a semiconductor substrate having a dielectric layer thereon;
   forming at least one semiconductor body having a dielectric cap on a top surface of the at least one semiconductor body from the dielectric layer and a semiconductor layer of the semiconductor substrate wherein the dielectric cap has a match stick head shaped cross section, wherein a width of the at least one semiconductor body is less than a maximum width of the dielectric, wherein the match stick shaped head cross section is wider at a portion distal from the substrate than a portion proximal the substrate, and wherein a material of the dielectric cap tapers along the at least one semiconductor body from a portion of the at least one semiconductor body distal to the substrate to a portion of the at least one semiconductor body proximal to the substrate;

forming a single gate dielectric layer on the at least one semiconductor body and the dielectric cap; and forming at least one electrically conducting gate on the gate dielectric layer.

7. The method according to claim 6, wherein the at least one semiconductor body includes a silicon fin.

8. The method according to claim 6, wherein the width of the at least one semiconductor body is in a range from approximately 5 nm to approximately 20 nm and the width of the dielectric cap is in a range from approximately 6 nm to approximately 25 nm.

9. The MOSFET structure according to claim 1, additionally including a source region and a drain region on opposite sides of a channel region of the at least one semiconductor body, the channel region having the electrically conductive gate thereover.

10. The MOSFET structure according to claim 1, wherein the gate dielectric layer conformally coats the dielectric cap.

* * * * *